(12) United States Patent
Hynes et al.

(10) Patent No.: US 7,426,133 B2
(45) Date of Patent: Sep. 16, 2008

(54) COMPLEMENTARY GIANT MAGNETO-RESISTIVE MEMORY WITH FULL-TURN WORD LINE

(75) Inventors: Owen J. Hynes, Otsego, MN (US); Roy R. Wang, Eden Prairie, MN (US); Romney R. Katti, Shorewood, MN (US); Daniel S. Reed, Maple Plain, MN (US)

(73) Assignee: Honeywell International, Inc., Morristown, NJ (US)

( * ) Notice: Subject to any disclaimer, the term of this patent is extended or adjusted under 35 U.S.C. 154(b) by 56 days.

(21) Appl. No.: 11/257,327

(22) Filed: Oct. 24, 2005

(65) Prior Publication Data

US 2007/0091669 A1     Apr. 26, 2007

(51) Int. Cl.
*G11C 11/00* (2006.01)
(52) U.S. Cl. .................. 365/158; 365/171; 365/173
(58) Field of Classification Search .............. 365/158, 365/171, 173, 190
See application file for complete search history.

(56) References Cited

U.S. PATENT DOCUMENTS

| | | | | |
|---|---|---|---|---|
| 4,547,866 A | * | 10/1985 | Lutes et al. ................ | 365/173 |
| 6,147,922 A | * | 11/2000 | Hurst et al. ................ | 365/225.5 |
| 6,175,525 B1 | * | 1/2001 | Fulkerson et al. .......... | 365/189.05 |
| 6,256,247 B1 | * | 7/2001 | Perner ........................ | 365/209 |
| 6,269,027 B1 | * | 7/2001 | Hurst, Jr. et al. ........... | 365/189.05 |
| 6,493,259 B1 | * | 12/2002 | Swanson et al. ............. | 365/158 |
| 6,532,168 B1 | * | 3/2003 | Swanson et al. ............. | 365/158 |
| 6,795,340 B2 | * | 9/2004 | Sakimura et al. ............ | 365/171 |
| 6,807,086 B2 | * | 10/2004 | Kajiyama .................... | 365/157 |

OTHER PUBLICATIONS

Reohr et al., Memories of Tommorow. Sep. 2002. IEEE Circuits & Devices Magazine.*

* cited by examiner

*Primary Examiner*—J. H. Hur
*Assistant Examiner*—Alexander Sofocleous
(74) *Attorney, Agent, or Firm*—McDonnell Boehnen Hulbert & Berghoff LLP

(57) ABSTRACT

A magneto-resistive memory system is presented that includes a radiation-hardened and low power memory cell. The magneto-resistive memory cell includes a word line select transistor in the cell to help eliminate unselected cell disturbances. Furthermore, the magneto-resistive memory cell includes a full-turn write word line that writes true and complimentary bit values using less current than previous cell architectures. The improved memory cell may be used in a memory system with precision current drivers and auto-zero sense amplifiers in order to further lower power and improve overall system reliability.

19 Claims, 4 Drawing Sheets

COMPLEMENTARY GIANT MAGNETO-RESISTIVE MEMORY WITH FULL-TURN WORD LINE

GOVERNMENT RIGHTS

The United States Government may have acquired certain rights in this invention pursuant to Contract No. N00030-01-C-0022 awarded by the Department of the Navy.

FIELD

The present invention relates to the field of static memory systems. More specifically, the present invention relates to a memory systems based on memory cells that utilize giant magneto-resistive components as static storage devices.

BACKGROUND

Digital memory circuits are significant components of virtually all digital processing systems, acting as storage of both data values and program instructions. With the increased use of solid-state multimedia devices, the demand for large capacity static read-write digital storage has also experienced a substantial increase. In order to fill this capacity, standard semiconductor memory architectures have been refined using advanced processing techniques in order to increase memory density by shrinking the area requirements of unit memory cells. Additionally, these processing techniques have been used to increase the speed of the static memory architectures. These non-volatile systems generally consist of arrays of memory cells based on semiconductor electronic devices, such as the floating transistors devices in erasable programmable read only memory (EPROM), electronically erasable programmable read only memory (EEPROM), and Flash memory systems. These device architectures currently serve as the basis for such industry standards as Compact Flash and Memory Stick digital storage technologies.

For more advanced applications, such as space-based systems, additional demands are placed on the digital memory systems over increased capacity and non-volatility. These demands include smaller active power consumption per memory unit access, and an increased resistance to radiation effects. The semiconductor electrical systems that are generally used for multimedia applications are extremely susceptible to corruption via radiation-induced errors. This is because the thin oxide layers surrounding the floating gates are susceptible to ionization damage resulting from high energy radiation particles. As a result, heavy radiation shielding is required to protect these memories in hostile environments, which can in turn lead to added costs and thermal management difficulties.

One type of memory architecture which has displayed excellent radiation resistance is magneto-resistive memory. In these types of memory systems, the memory unit cells are based on magnetic components that can be placed into static electrically resistive states. Because the data storage characteristics of these memory cells are based on inherent magnetic as opposed to electrical properties, they are generally immune to ionizing radiation effects. Additionally, they allow for nearly unlimited transitions before the material properties of the memory cells degrade to the point of instability.

This type of memory is based on the principles of the giant magneto-resistive (GMR) effect, which shows that a magnetic field can be used to align the spin of electrons in a ferromagnetic material and thereby change its electrical resistance. In magneto-resistive memory, data is stored in stacks containing thin layers of alternating magnetic and non-magnetic layers. One or more of the magnetic layers may be a bounded layer where the magnetic dipoles of the layers are aligned to a single general reference direction. At least one other magnetic layer in the system may act as a "free layer" whose magnetic dipoles can generally be set to one of two opposite directions, being parallel and anti-parallel to the magnetic dipoles of the bounded layer. Because of the GMR effect, when these stacks are subject to a relatively strong external magnetic field, the spin of the electrons in some of the magnetic layers may be altered in the sense above to be either all aligned or anti-aligned. Based on the formation of the other stack layers, these two states may correspond to distinct high and low resistive states, resulting in either an "open" or "closed" electrical current conducting condition. Specifically, when the spin of the electrons in the free layer is in opposition to that of the bounded layers, the spin-dependent scattering of charge carriers is maximized in the material, thereby creating higher resistance and a "closed" valve. Likewise, when the spin of the electrons in the free layer parallels that of the bounded layer this scattering is reduced, thereby producing an "open" valve. Because of this transitional behavior, the material stacks, or "spin-valves" may be used to store binary data.

In order to read the data stored by the spin-valves, a combination of current drivers and sensing devices may be used to test the resistance of the valve stack layers. When a standard current generated by a current driver is applied to the spin-valve, a voltage potential is generated, which is indicative of either a relatively high or low resistive electrical element. This potential can be sensed by a voltage sense amplifier that may then be used to extract the original state of the valve. Additionally, more advanced components may be included with the voltage sense amplifier in order to increase the accuracy and speed of the sensing sub-system. For example, auto-zeroing sense amplifiers, or chopper-stabilized amplifiers, may be utilized which help to increase the sensitivity of the detection circuitry. An auto-zero sense amplifier having offset calculation is able to account for a continuous internal offset voltage by storing the offsets in one or more coupling capacitors, thereby helping to reduce the overall noise of the detection system.

To change the state of a spin-valve, and thereby write a binary value to the structure, a magnetically-coupled current-carrying write line may be used. Moving charges passing through this write line generate a magnetic field that varies radially in strength, and is directed tangentially to both the axis defined by the direction of current flow in the write line and the radial axis of the write line. In this sense, currents flowing in opposite directions to each other in the same write line generate magnetic fields that are also opposite in direction at the same point in space. The free magnetic layers in a spin valve device will then align to a general direction defined by an applied magnetic field, with the binary directional limitations provided by the bounded layers.

A substantial amount of the overall power utilized by an MRAM system is consumed during writing operations of the individual cells. As a result, it would be desirable to develop a giant magneto-resistive memory cell that has substantially lower per-write power consumption as a result of, for example, a decreased writing current. Additionally, a system that incorporates such a memory cell system should also contain a high-speed sensing subsystem comprising sense amplifiers with the ability to reliably detect low voltage signal levels, thereby permitting the use of lower system voltages and currents that can also provide substantial power savings.

BRIEF DESCRIPTION OF THE DRAWINGS

Exemplary embodiments of the invention are described below in conjunction with the appended figures, wherein like reference numerals refer to like elements in the various figures, and wherein.

DETAILED DESCRIPTION OF THE INVENTION

1. Exemplary Hardware

Figure 1:
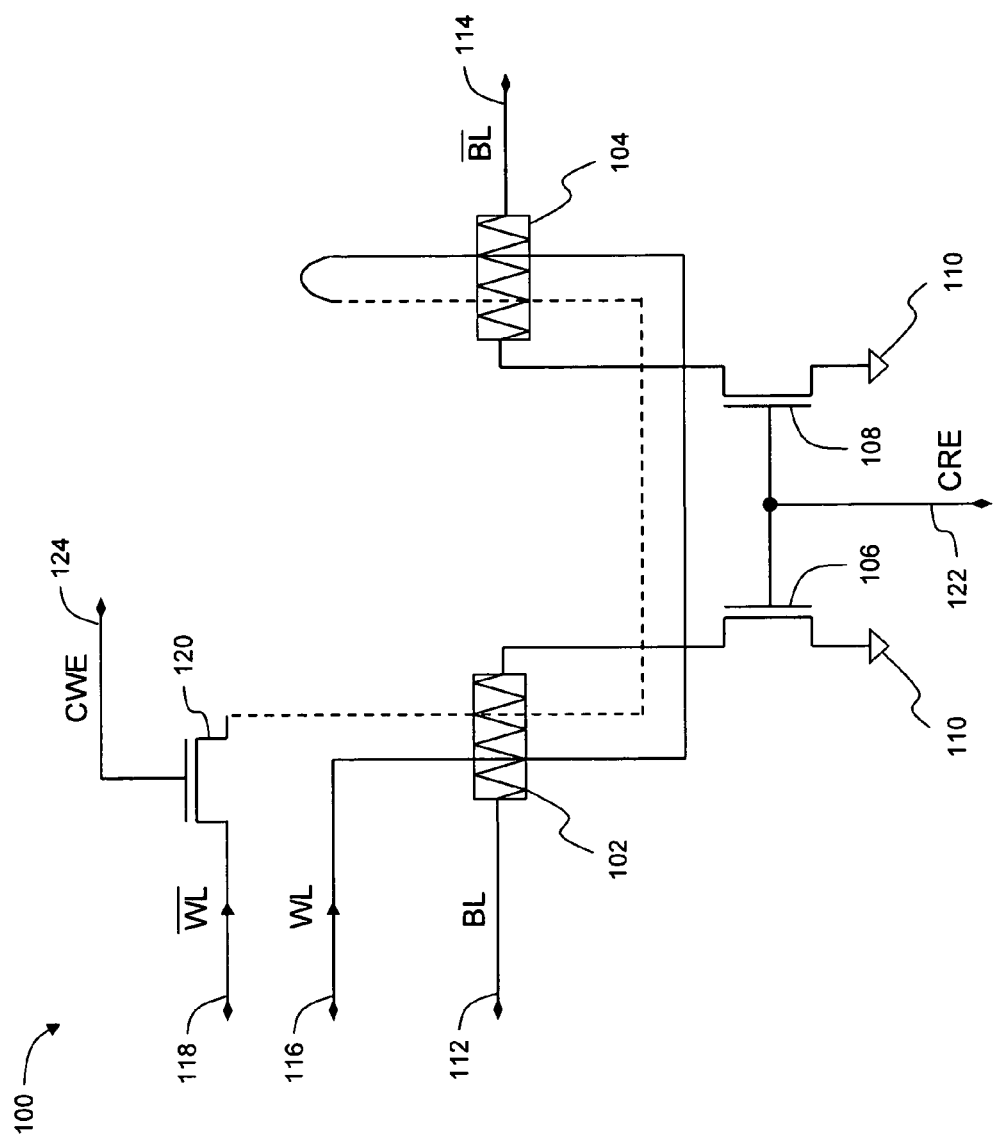
FIG. 1 is a schematic diagram showing a magneto-resistive memory cell according to an exemplary embodiment.

FIG. 1 is a schematic diagram showing a magneto-resistive random access memory (RAM) cell of one embodiment of the invention. The structure shown is a full memory cell structure containing two bit value storage devices 102 and 104, which may be used to store true and complimentary bit values, respectively. These bit value storage devices may be any apparatus that can store a binary value and can be magnetically coupled to a writing mechanism, such as a current conducting write line 116, 118. Specifically, the bit value storage devices 102 and 104 may be giant magneto-resistive spin-valve elements. These spin-valve elements used as bit value storage devices 102 and 104 may comprise multiple layers of electrically conductive material, with alternating magnetic and non-magnetic layers.

Both of these bit value storage devices 102 and 104 may be electrically coupled to a single write line 116. The write line 116 is able to conduct bidirectional current, where the direction of the current flow can be used to determine the values to be written to the bit storage devices 102 and 104. Preferably, the write line 116 is positioned relative to the first bit storage device 102 and second bit storage device 104 such that the magnetic field imposed by the write line 116 on the first bit storage device 102 is opposite in direction to the magnetic field imposed by the write line 116 on the second bit storage device 104 with respect to the relative orientations of the bounded layers of each device. Essentially, for a given direction of current passing through the write line 116 the magnetic field imposed on the first bit storage device 102 should be substantially in the same direction as the magnetic dipoles of the bounded layer of the device, while the magnetic field imposed on the second bit storage device 104 should be substantially in the opposite direction of the magnetic dipoles of the bounded layer of that device; for current flow in the opposite direction, the magnetic fields at the two bit storage devices 102, 104 will be reversed in their respective directions. This characteristic ensures that complimentary binary values are written to the bit storage devices 102, 104. Additionally, it is ideal that the magnetic fields imposed on the bit storage devices 102, 104 by the write line 116 are substantially equal in magnitude, thereby ensuring a relatively similar electrical load characteristic on the write line 116 for both high and low writes to the true bit storage device 102. This can be accomplished by adjusting the surface area exposed between the write line 116 and the bit storage devices 102, 104 or by modifying the dielectric material, if any, used between the write line 116 and bit storage devices 102, 104 based in part on magnetic permittivity.

The write line 116 of the memory cell may be a full-turn wire, allowing for stronger magnetic coupling between the line and the magnetic bit storage devices 102, 104. In a full-turn configuration, the write line 116 loops around each of the devices, making one pass over the bit storage device in one direction and another pass under the device in the opposite direction. The net result is essentially a doubling of the magnetic field magnitude at each of the bit storage devices as a result of a given current passing through the write line. This allows for a lower current to be used to write the memory cell, as opposed to a device with a single pass write line configuration, and permitting the memory system to utilize less overall power.

Figure 2:
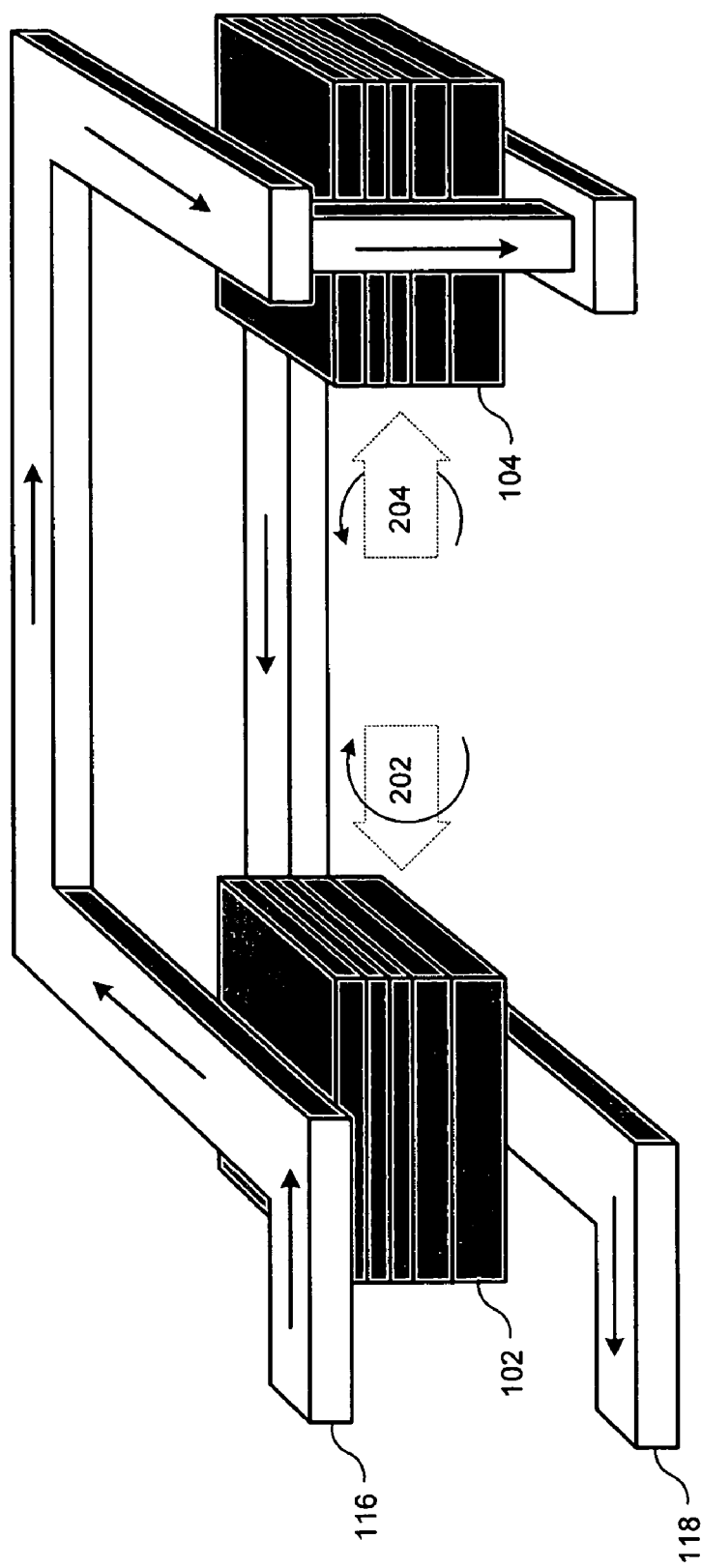
FIG. 2 is an illustration of a full-turn write line wrapping around two spin-valve elements according to an exemplary embodiment.

FIG. 2 illustrates how a single full-turn write line may be used to write substantially opposite values to two separate spin-valve devices. Two spin-valve devices 102, 104 with bounded layers oriented substantially in the same direction are magnetically coupled to a single full-turn write line having two terminations 116, 118. As shown, current originating at a first termination 116 and flowing towards a second termination 118 will result in a magnetic field 202 applied to the first spin-valve device 102 having an opposite direction to that of the magnetic field 204 applied to the second spin-valve device 104. As a result, the respective free layers in each of the spin-valve devices will be set to opposite resistive values.

Because a single current driver may be used to drive the write function of an entire RAM system, it may be necessary to isolate individual cells that are not undergoing the writing process. To enable this isolation, the memory cell may contain at least one switch that conditionally allows current to flow the write line 116. This cell write enable switch 120 may be controlled by a cell write enable signal (CWE) 124 that allows the write line to be electrically coupled to the write line current driver of the system when the signal is activated. The write enable switch 120 may comprise a single NMOS transistor used as a pass transistor with the cell write enable signal connected to the gate of the transistor. The cell write enable signal may be generated locally by gate logic, or may be generated externally in a memory system control unit.

Values stored on the bit storage devices 102, 104 may be read by passing a current through bit lines 112, 114 coupled to the storage devices, and sensing the differential voltage that is generated between the lines. In order to selectively choose which RAM cell to read in the system, a pair of switches 106, 108 may be used to conditionally allow current to flow through the bit lines 112, 114 and their respective storage devices 102, 104. A single cell read enable switch may be associated with each of the storage devices, with a first read enable switch 106 being having one end connected to the true bit storage device 102 and the other end connected to a reference voltage 110; likewise, the second read enable switch 108 may be located between the complementary bit storage device 104 and the same reference voltage 110. Preferably the above reference voltage 110 used in the read circuit may be electrical ground. Both read enable switches 106, 108 may be controlled by a single cell read enable signal (CRE) 122 that is generated by local gate logic.

Figure 3:
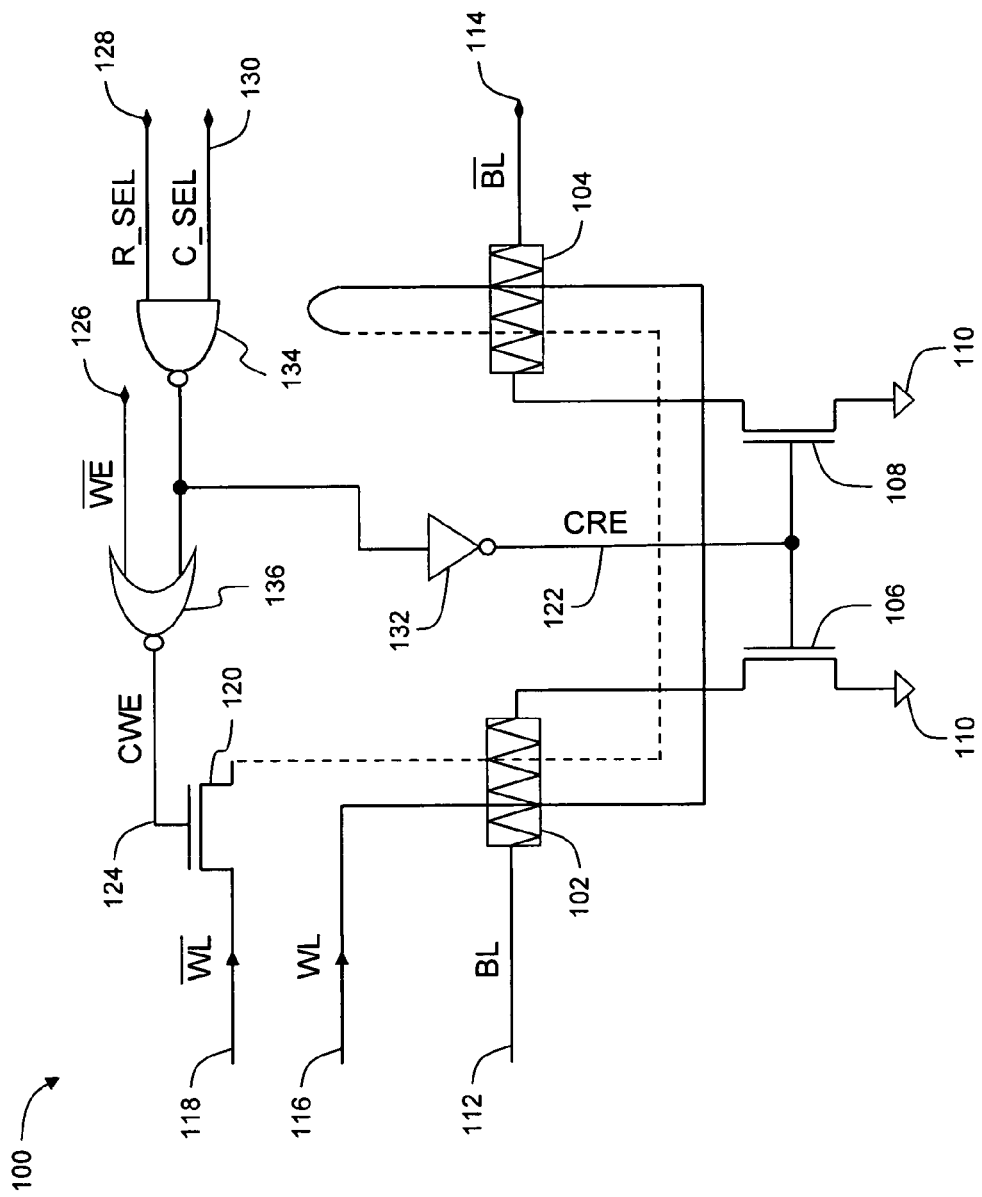
FIG. 3 is a schematic diagram showing a magneto-resistive memory cell including control signal logic according to an exemplary embodiment.

FIG. 3 is another schematic diagram showing a magneto-resistive random access memory (RAM) cell of one embodiment of the invention including control signal gate logic. The logic used to generate the cell write enable signal 124 and cell read enable signal 126 may be generated externally or internally. In one representation, the control logic signals may be generated externally within the memory architecture system control unit in order to increase RAM cell density. In the representation shown in FIG. 2, three general logic signals are used to generate the cell-specific enable signals. These externally generated general signals comprise a row selection signal (R_SEL) 128, a column selection signal 1(C_SEL) 30, and a write enable complement signal (WE) 126. These three signals may be generated by higher level control logic at the memory architecture system level. Additionally, other general signals may be used as inputs in determining the memory cell enable signals.

In one representation, the internal cell logic used to generate the cell write enable 124 and cell read enable 122 signals may comprise three logic gates in a two-level logic system: the row select signal 128 and column select signal 130 may input into a NAND gate 104 to generate an intermediate result; this intermediate result and the write enable complement signal 126 may input into a NOR gate to generate the cell write enable signal 124; additionally, the intermediate result may also be inverted by an inverter 132 to generate the cell read enable signal 122. Alternatively, other control logic arrangements with more signal redundancy may be used to generate the cell enable and command signals.

Figure 4:
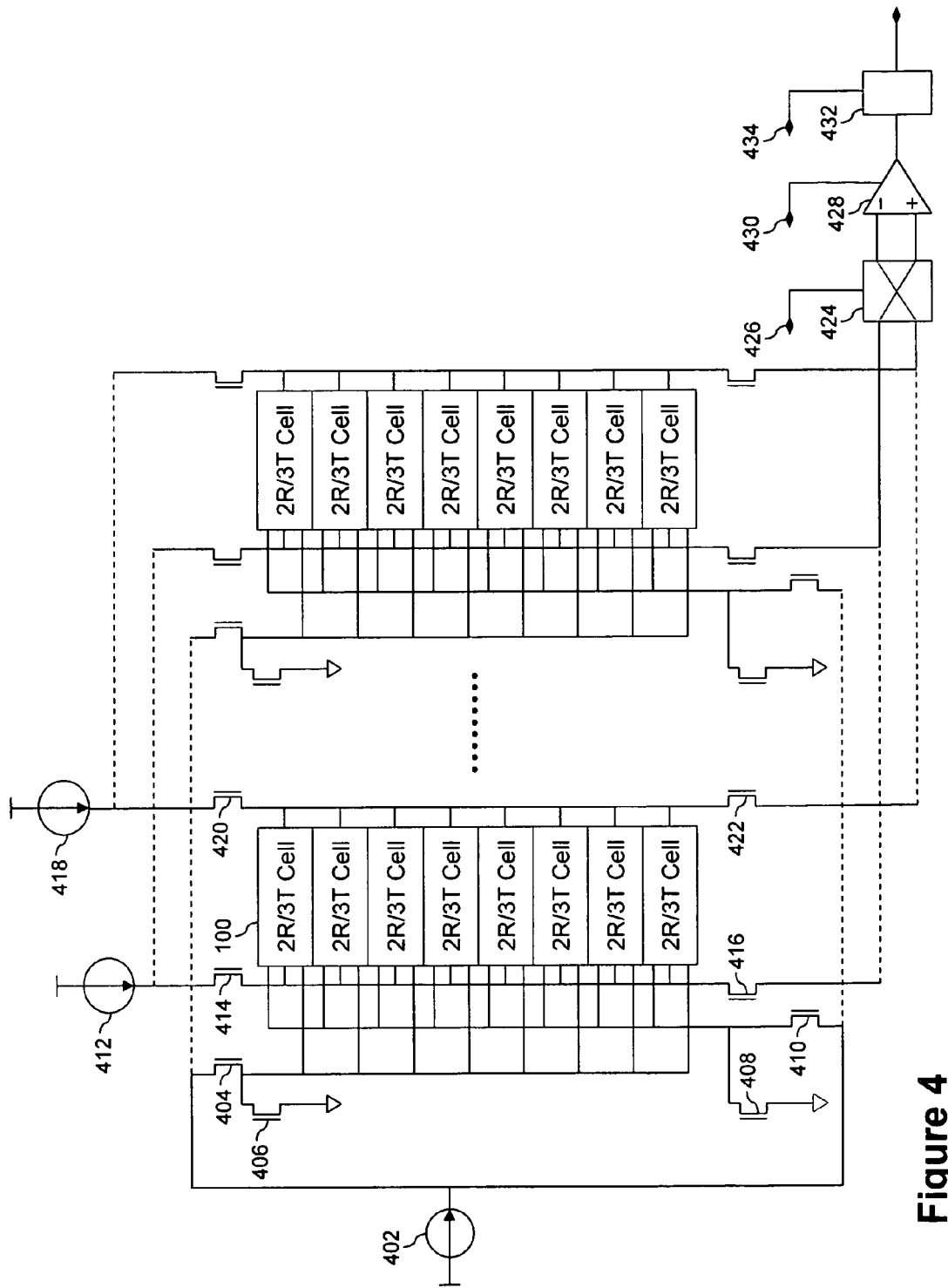
FIG. 4 is a schematic diagram showing a magneto-resistive memory system according to an exemplary embodiment.

FIG. 4 is a schematic showing a memory system architecture that utilizes the magneto-resistive memory cell of the present invention, according to one embodiment. The system may contain multiple rows and columns of magneto-resistive memory cells 100. The rows and columns shown in the system may represent a single bank or other sub-division in a larger random access memory device. The system shown in FIG. 4 has eight rows of memory cells, and multiple columns, of which two are explicitly shown. The system may comprise a word line driver 402 that may be selectively connected to the word line 116, 118 in each memory cell. The direction of the current flow provided to each memory cell 100 may be controlled through the use of four word line control transistors 404, 406, 408, 410. By activating two word line control transistors 404, 408 current generated by the world line current driver 402 may be routed through the memory cell and to electrical ground in one direction; by activating the other two control transistors 406, 410 current may be routed in the other direction through the memory cell. Four word line control transistors may be used by each column of memory cells. A single word line driver may be utilized by each memory bank or subdivision, or alternatively multiple word line drivers may be used.

In addition, the memory system may comprise two bit line current drivers 412, 418. These bit line current drivers may be used as current sources for generating a differential voltage output at each memory cell during a read operation. The true bit line driver 412 may be selectively connected to the bit line 112 of a memory cell, while the complementary bit line driver 418 may be selectively connected to the complementary bit line 114 of a memory cell. Two bit line control switches may be utilized for each bit line, and for each column of memory cells in order to selectively permit current from each driver to flow through the memory cells of the column. For the true bit line current driver 412 a first transistor 414 may control current flow to the column of memory cells, while a second transistor 416 may couple the output of the true bit line of the memory cells to sensing circuits. Likewise, for the complementary current driver 418, a first transistor 420 may control current flow to the column of memory cells, while a second transistor 422 may couple the output of the complementary bit line of the memory cells to the sensing circuits. In addition to the four bit line control switches, the memory cell control logic also determines which cell will be coupled to the bit line current drivers. Also, one true and one complementary bit line driver may be utilized by each memory bank or subdivision, or multiple true and complementary bit line drivers may be used.

During a read operation, the control logic and control switches route the current from the bit line drivers 412, 418 to a single magneto-resistive memory cell. The output from the true and complementary bit lines may be sent to a voltage sensing circuitry. This circuitry may comprise a differential voltage switch 424 along with an auto-zero sense amplifier 428 having offset cancellation. Using both of these components in series it may be possible to substantially increase the sensitivity of the system.

One method involves combining the auto-zeroing capabilities of the auto-sense amplifier 428 using offset cancellation with a switch output that essentially doubles the sensitivity of the overall system. During a first time period, the switch 424 may route the true and complementary and bit line outputs to the positive and negative input terminals of the sense amplifier 428, respectively. With this switch configuration, the auto-zero function of the auto-zero sense amplifier may be activated through a control signal 430, creating an offset that cancels the differential voltage input of the true and complementary bit lines. The respective offset voltages may be stored on capacitive nodes within the auto-zero sense amplifier 428. After the offsets have been created and stored and during a second time period, the voltage switch 424 may change the routing of the signals such that the complementary bit line output is routed to the positive terminal and the true bit line output is routed to the negative terminal. During this second time period, the differential sense amplifier 428 will register an input that is substantially twice the difference of the actual input provided by the true and complimentary bit line. The sensing circuitry may be controlled through a switch signal 426 that controls the voltage switch outputs, and an auto-zeroing signal 430 that controls the auto-zeroing and offset determination functions of the differential amplifier. Both the switch signal 426 and the auto-zeroing signal 430 may be generated externally by memory controller logic.

The output of the differential sense amplifier 428 may then be sent to an output latch 432. The latch may then store the output of the differential sense amplifier 428 after the outputs are switched and the sense amplifier reflects the substantially doubled differential input. The latch 432 may also accept a latch control signal 434 that determines when the latch holds and stores the differential amplifier output. Once stored, the value in the output latch may then be output to the memory input/output interface.

Exemplary embodiments of the present invention relating to a magneto-resistive memory cell and memory system have been presented. It should be noted that more significant changes in configuration and form are also possible and intended to be within the scope of the system taught herein. For example, additional control circuitry and redundant components may be added to the memory cell in order to increase stability and reliability. Additionally, instead of a the write line making a single full turn around the magneto-resistive storage bits, the write line may make multiple turns around the bits in an effort to increase coupling.

Finally, in view of the wide variety of embodiments to which the principles of the present invention can be applied, it should be understood that the illustrated embodiments are exemplary only, and should not be taken as limiting the scope and spirit of the present invention. For example, the memory cell is not limited to the architecture system presented and may be used in a variety of different memory architectures that are compatible with magneto-resistive memory cells.

Additionally, the claims should not be read as being limited to the described order or elements unless stated to that effect.

We claim:

1. A magneto-resistive memory cell comprising:
   a first magneto-resistive bit storage device having a first end and a second end;
   a second magneto-resistive bit storage device having a first end and a second end;
   a full-turn, single cell routed write word line that is used to write to both the first magneto-resistive bit storage device and the second magneto-resistive bit storage device;
   a first read switch that receives a cell read enable signal and selectively couples the first end of the first magneto-resistive bit storage device to a reference voltage; and
   a second read switch that receives the cell read enable signal and selectively couples the first end of the second magneto-resistive bit storage device to the reference voltage.

2. The magneto-resistive memory cell of claim 1 wherein the write word line wraps around the first magneto-resistive bit storage device in a first direction and wraps around the second magneto-resistive storage device in a second direction opposite to the first direction, and where the write word line is used to set the value of the first and second magneto-resistive bit storage devices to complementary binary values.

3. The magneto-resistive memory cell of claim 2 further comprising
   a write line select switch that receives a cell write enable signal and selectively allows current to flow through the write word line.

4. The magneto-resistive memory cell of claim 3 wherein the write line select switch comprises an n-type metal oxide semiconductor (NMOS) transistor.

5. The magneto-resistive memory cell of claim 1 wherein the first magneto-resistive bit storage element and the second magneto-resistive bit storage element comprise giant magneto-resistive spin-valve elements.

6. The magneto-resistive memory cell of claim 5 wherein the giant magneto-resistive spin-valve elements comprise multiple layers of electrically conductive material, with alternating magnetic and non-magnetic layers.

7. The magneto-resistive memory cell of claim 1 wherein the first read switch and second read switch comprise an n-type metal oxide semiconductor (NMOS) transistor.

8. The magneto-resistive memory cell of claim 1 wherein the reference voltage is electrical ground.

9. A magneto-resistive memory cell comprising:
   a first magneto-resistive bit storage device having a first end and a second end;
   a second magneto-resistive bit storage device having a first end and a second end;
   a full-turn, single cell routed write word line that is used to write to both the first magneto-resistive bit storage device and the second magneto-resistive bit storage device;
   a write line select switch that selectively allows current to flow through the write word line, the write line select switch receiving a cell write enable signal;
   a first read switch that selectively couples the first end of the first magneto-resistive bit storage device to a reference voltage, the first read switch receiving a cell read enable signal;
   a second read switch that selectively couples the first end of the second magneto-resistive bit storage device to the reference voltage, the second read switch receiving the cell read enable signal; and
   control signal generation logic that outputs the cell write enable signal and the cell read enable signal.

10. The magneto-resistive memory cell of claim 9 wherein the control signal generation logic receives a row select signal, a column select signal, and a not-write enable signal.

11. The magneto-resistive memory cell of claim 9 wherein the control signal generation logic comprises a NAND logic block, a NOR logic block, and an inverter.

12. A magneto-resistive memory cell comprising:
   a first magneto-resistive bit storage device having a first end and a second end;
   a second magneto-resistive bit storage device having a first end and a second end;
   a full-turn, single cell routed write word line that is used to write to both the first magneto-resistive bit storage device and the second magneto-resistive bit storage device;
   a write line select switch that selectively allows current to flow through the write word line, the write line select switch receiving a cell write enable signal;
   a first read switch that selectively couples the first end of the first magneto-resistive bit storage device to a reference voltage, the first read switch receiving a cell read enable signal;
   a second read switch that selectively couples the first end of the second magneto-resistive bit storage device to the reference voltage, the second read switch receiving the cell read enable signal; and
   control signal generation logic which comprises a NAND logic block, a NOR logic block, and an inverter, the control signal generation logic receives a row select signal, a column select signal, and a not-write enable signal and outputs the cell write enable signal and the cell read enable signal, wherein the NAND logic block generates an intermediate signal through operation on the row select signal and the column select signal, and wherein the NOR logic block generates the cell write enable signal through operation on the intermediate signal and the not-write enable signal.

13. A magneto-resistive memory cell comprising:
   a first magneto-resistive bit storage device having a first end and a second end;
   a second magneto-resistive bit storage device having a first end and a second end;
   a full-turn, single cell routed write word line that is used to write to both the first magneto-resistive bit storage device and the second magneto-resistive bit storage device;
   a write line select switch that selectively allows current to flow through the write word line, the write line select switch receiving a cell write enable signal;
   a first read switch that selectively couples the first end of the first magneto-resistive bit storage device to a reference voltage, the first read switch receiving a cell read enable signal;
   a second read switch that selectively couples the first end of the second magneto-resistive bit storage device to the reference voltage, the second read switch receiving the cell read enable signal; and
   control signal generation logic which comprises a NAND logic block, a NOR logic block, and an inverter, the control signal generation logic receives a row select signal, a column select signal, and a not-write enable signal and outputs the cell write enable signal and the cell read enable signal, wherein the NAND logic block generates an intermediate signal through operation on the row select signal and the column select signal, and wherein the inverter generates the cell read enable signal through operation on the intermediate signal.

14. A memory architecture for a magnetic random access memory system (MRAM) comprising:
at least one magneto-resistive memory cell that outputs a differential voltage, the memory cell comprising:
a first magneto-resistive bit storage device having a first end and a second end;
a second magneto-resistive bit storage device having a first end and a second end; and
a write word line that wraps around the first magneto-resistive bit storage device in a first direction and wraps around the second magneto-resistive bit storage device in a second direction opposite of the first direction and where the write word line is used to set the value of the first and second magneto-resistive bit storage devices to complementary binary values;
a current source that provides a sense current to the at least one memory cell;
an amplifier stage that amplifies the differential signal output by the at least one magneto-resistive memory cell; and
a storage device that stores the value of the memory cell output by the amplifier stage.

15. The memory architecture of claim 14 wherein the memory cell further comprises:
a word line select switch that receives a word line select signal and selectively allows current to flow through the write word line.

16. The memory architecture of claim 14 wherein the memory cell further comprises:
a first read switch that receives a cell selection signal and selectively couples the first end of the first magneto-resistive bit storage device to a reference voltage;
a second read switch that receives the cell selection signal and selectively couples the first end of the second magneto-resistive bit storage device to the reference voltage.

17. The memory architecture of claim 14 wherein the amplifier stage comprises an auto-zeroing sense amplifier.

18. The memory architecture of claim 14 further comprising a preamplifier stage located between the at least one magneto-resistive memory cell and the amplifier stage.

19. The memory architecture of claim 18 wherein the preamplifier stage comprises a differential voltage doubling switch.

* * * * *